United States Patent
Ballagh et al.

(10) Patent No.: US 7,269,811 B1
(45) Date of Patent: Sep. 11, 2007

(54) METHOD OF AND APPARATUS FOR SPECIFYING CLOCK DOMAINS IN ELECTRONIC CIRCUIT DESIGNS

(75) Inventors: Jonathan B. Ballagh, Longmont, CO (US); Roger B. Milne, Boulder, CO (US); Jeffrey D. Stroomer, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 1066 days.

(21) Appl. No.: 10/340,005

(22) Filed: Jan. 10, 2003

(51) Int. Cl.
*G06F 17/50* (2006.01)
*G06F 9/45* (2006.01)

(52) U.S. Cl. .................................. 716/6; 716/1; 716/4
(58) Field of Classification Search ............... 716/1, 716/4, 6
See application file for complete search history.

(56) References Cited

U.S. PATENT DOCUMENTS

| | | | |
|---|---|---|---|
| 6,014,510 A * | 1/2000 | Burks et al. ................. | 703/19 |
| 6,099,579 A * | 8/2000 | Dowling et al. ............. | 716/6 |
| 6,338,025 B1 * | 1/2002 | Bowen et al. ............... | 702/60 |
| 2002/0129324 A1 * | 9/2002 | Iadonato et al. ............ | 716/10 |
| 2003/0106029 A1 * | 6/2003 | Kishinevsky et al. ........ | 716/4 |
| 2003/0212973 A1 * | 11/2003 | Lin et al. .................... | 716/6 |
| 2004/0060019 A1 * | 3/2004 | Secatch et al. .............. | 716/6 |
| 2004/0216063 A1 * | 10/2004 | Dickey et al. ............... | 716/7 |
| 2004/0268279 A1 * | 12/2004 | Oleksinski et al. .......... | 716/6 |

* cited by examiner

*Primary Examiner*—Stacy A. Whitmore
*Assistant Examiner*—Magid Y. Dimyan
(74) *Attorney, Agent, or Firm*—John J. King

(57) ABSTRACT

A method of specifying clock domains in electronic circuit designs in a system level design tool is disclosed. The method generally comprises steps of providing a design having a plurality of functional blocks; incorporating a clock tag block within the design; and setting a clock domain provided by the clock tag block for a functional block of the plurality of functional blocks. A design tool enabling the association of clock domains with functional blocks in a system is also disclosed. The design tool generally comprises a plurality of functional blocks; a clock tag block having a predetermined clock rate; and a user interface enabling the selection of the functional blocks and the clock tag block in a design. The clock tag block provides a clock rate for at least one functional block of the plurality of functional blocks.

33 Claims, 4 Drawing Sheets

METHOD OF AND APPARATUS FOR SPECIFYING CLOCK DOMAINS IN ELECTRONIC CIRCUIT DESIGNS

FIELD OF THE INVENTION

This invention relates generally to electronic circuit design, and in particular, to a method of and apparatus for specifying clock domains in electronic circuit designs.

BACKGROUND OF THE INVENTION

Many tools allow electronic designs to be assembled, simulated, debugged, and translated into hardware. In particular this can be done in the environments known as high level modeling systems (HLMS). In a HLMS the high level design (i.e., the design as the user sees it) can be quite different from what is implemented in hardware. In particular, clocks often are only implicit in a high level design, but must be explicit in hardware. Users need to control how implicit high level clocks are translated into explicit hardware clocks.

A high level design can be thought of as a collection of blocks that communicate with one another through signals. Signals are discrete time varying sequences of values. Some signals change rapidly, while others change less often.

In hardware, blocks become processing elements such as counters, registers, logic gates, etc., and signals become electrical impulses that travel between processing elements. In a synchronous electronic design, rates and offsets of signals are governed by clocks. The obvious way to implement a design having, for example, three signal rates is to use three separate hardware clocks. Another approach is to use a single clock together with three clock enables varying at appropriate rates.

These approaches can be mixed. For example, two of the three rates might be realized with a single clock but different enables, while the third might be realized with a second clock. A clock domain is the portion of a hardware design that is controlled by a single clock (but possibly different enables). Thus, a three rate design that has one clock but three enables has a single domain. If, instead, the design is implemented with the mixed approach described above, there are two domains.

The choice of domains is a detail of implementation. It is irrelevant in the high level view but essential when trying to minimize cost and maximize speed of hardware. For example, suppose a three rate design is to be realized in a field programmable gate array (FPGA) that is able to support at most two clock domains. The design can be implemented in the device, but only by using one or two domains. If using two domains is faster and requires no extra hardware, the user is likely to request two. Further cost and speed improvements may be possible by dictating which of the rates should be realized in the same domain. The problem, therefore, is to enable a user to have a high level and abstract view of a design, but nevertheless be able to specify how clock domains should be used in hardware.

Accordingly, there is a need for a method of and apparatus for specifying clock domains in a system level design tool.

Accordingly, there is a need for a method of and apparatus for verifying the correctness of a clock domain specification.

SUMMARY OF THE INVENTION

A method of specifying clock domains in electronic circuit designs in a system level design tool is disclosed. The method generally comprises steps of providing a design having a plurality of functional blocks; incorporating a clock tag block within the design; and setting a clock domain provided by the clock tag block for a functional block of the plurality of functional blocks.

A design tool enabling the association of clock domains with functional blocks in a system is also disclosed. The design tool generally comprises a plurality of functional blocks; a clock tag block having a predetermined clock rate; and a user interface enabling the selection of the functional blocks and the clock tag block in a design. The clock tag block provides a clock rate for at least one functional block of the plurality of functional blocks.

DETAILED DESCRIPTION OF THE DRAWINGS

The present invention relates to a method and apparatus for specifying clock domains in an electronic circuit design. The present invention is preferably implemented in software, such as a design tool for electronic circuits. The software allows clock domains to be associated with portions of the design. A clock domain is specified either with a 'clock tag' block or a configuration parameter on the block that drives the signal. The clock domain is preferably propagated to signals downstream until a rate-changing block is reached, or another clock domain is specified. This approach allows flexible control of clock association, while retaining convenience.

The method and apparatus of the present invention eliminates the need to specify the clock domain on an individual block-by-block basis. The clock tag block provides a mechanism for associating a portion of the design with a particular clock domain in the design tool. The clock tag block preferably has a single input and output port, and acts as a pass through for data. The clock tag block is preferably inserted in a signal only. Use of this block in an existing design, therefore, does not change the simulation results after its inclusion. It is however, possible to combine other functionality into a clock tag block such as rate changing and explicit clock tagging.

Figure 1:
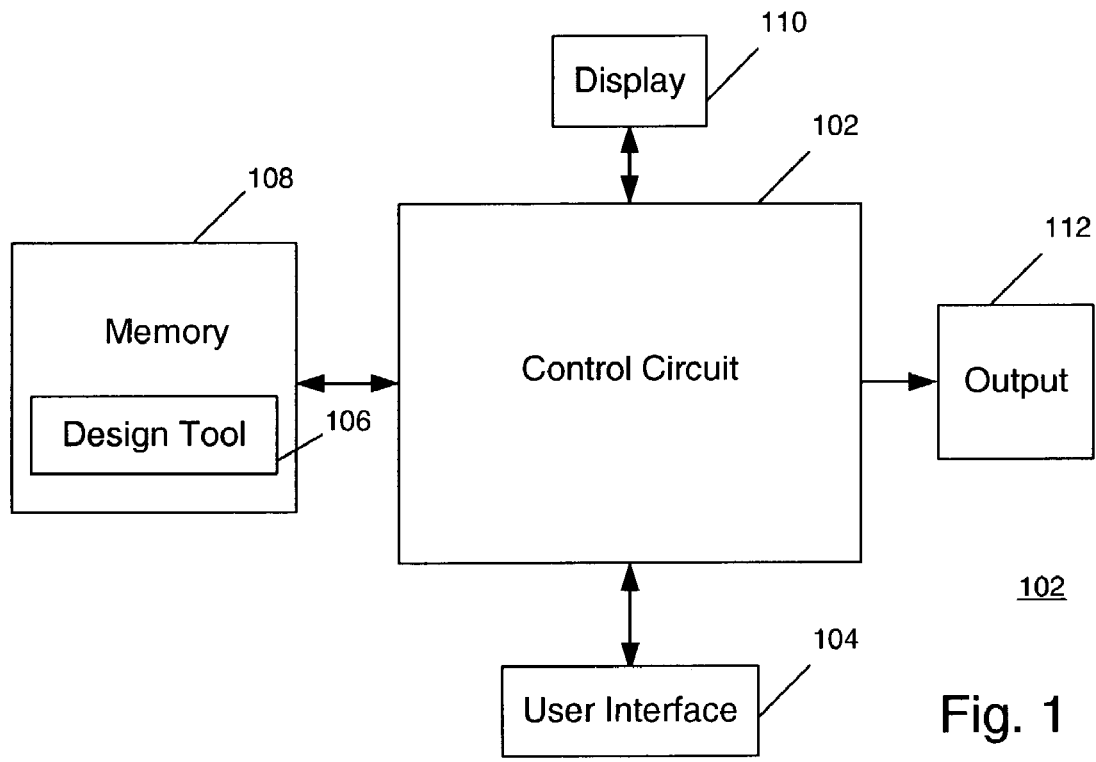
FIG. 1 is a block diagram of a system for specifying clock domains according to the present invention.

Turning now to FIG. 1, a block diagram shows an example of a system for specifying clock domains according to the present invention. In particular, a control circuit 102 is coupled to a user interface 104. A user employing the method and apparatus of the present invention can access a design tool 106 stored in a memory 108. The design tool enables the display of a design flow or circuit layout on a display 110. The elements of FIG. 1 could be implemented as stand-alone elements, or some combination of the elements shown. Similarly, the elements could be employed in a single device or a plurality of devices. According to one particular application of the present invention, a software program employing a method of the present invention could be employed on a conventional computer. Control circuit 102 could be, for example, a microprocessor of the computer, while memory 108 could be a memory storing a software program comprising the design tool 106 which implements the method of the present invention.

The design tool could be any program for designing and/or implementing a system level design, and could be applied in any flow that supports propagation of system properties such as sample rates, data rates, and clock domains. The invention could further be extended to textual-based design environments having propagation capabilities.

Figure 2:
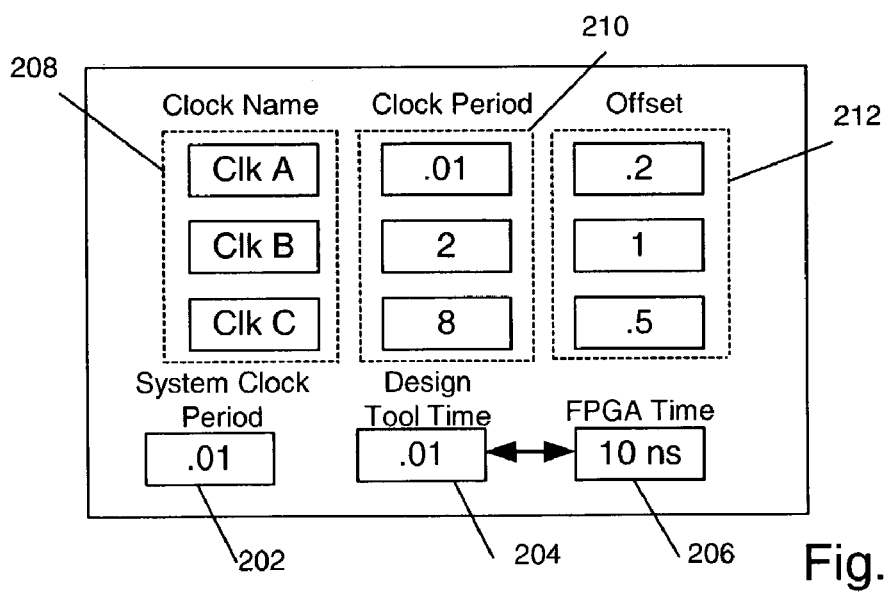
FIG. 2 shows user selectable fields for implementing the method and apparatus for specifying clock domains according to the present invention.

Turning now to FIG. 2, a user interface having several user selectable fields according to the present invention is shown. The system clock period field 202 allows the basic unit of design tool time to be specified. Design tool time field 204 and FPGA time field 206 specify the relationship between design tool time and hardware time. Clock name field 208 specifies the name of a clock domain, while clock period field 210 specifies the period, expressed in design tool time units, of the domain. Offset field 212 specifies the domain's offset, again expressed in design tool time. These fields could be preferably accessed by a user on the user interface, for example by using a keypad or using a mouse to increase or decrease the values as desired.

Taken together, the fields allow the user to specify details of hardware implementation for clock domains. For example, FIG. 2 specifies there is a clock domain named Clk A, and that its clock period and offset, expressed in design tool time, are 0.01 and 0.2 respectively. Because 0.01 units of design tool time correspond to 10 ns of hardware time, the domain will have a period of 10 ns and offset of 200 ns respectively in hardware.

The fields also allow the design tool to verify the correctness of clock domain specifications. For example, it may be essential that a particular block run at the system rate. The design tool can verify this by checking that the block belongs to a clock domain whose clock period matches that of the system clock period. Another possible check is that number of domains and/or their characteristics are realizable in the target hardware.

As will be described in more detail in reference to the remaining figures, these various clock tag blocks can be inserted in a design flow according to the present invention. The clock domain established by the user in the clock tag block preferably satisfies certain conditions. The sample period of the input signal should be divisible by the sample period of the specified clock domain. For example, assume the input signal driving the clock tag block has a sample period of 2. A clock domain with a period of 1 or 2 would be acceptable, while a domain with a period of 3 would not. The offset of the specified clock domain must be the same as the offset of the input signal. Such requirements are also preferably applied to downstream blocks inheriting the clock domain.

Figure 3:
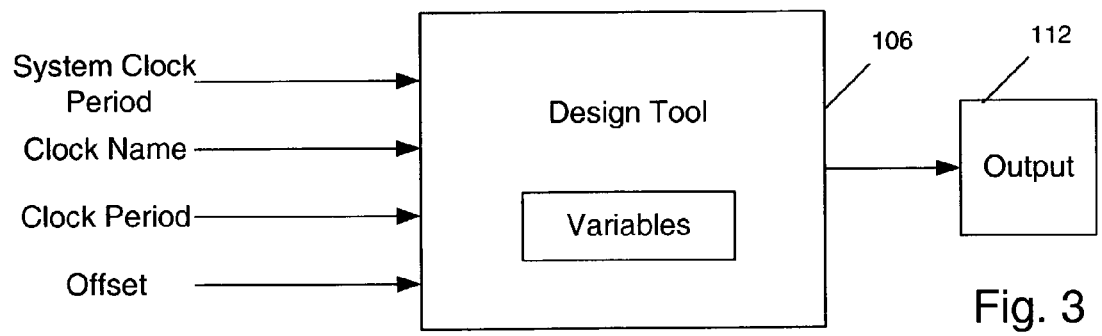
FIG. 3 is a block diagram showing system inputs for implementing the method and apparatus for specifying clock domains according to another aspect of the present invention.

Turning now to FIG. 3, a block diagram shows system inputs for implementing the method and apparatus of enabling a design flow having a plurality of clock domains according to an alternate embodiment of the present invention. In particular, the design tool is adapted to receive various inputs, such as a system clock period, a clock name, a clock period, and an offset, and generate an output 112. The various inputs enable establishing a plurality of clock tag blocks according to the present invention.

Figure 4:
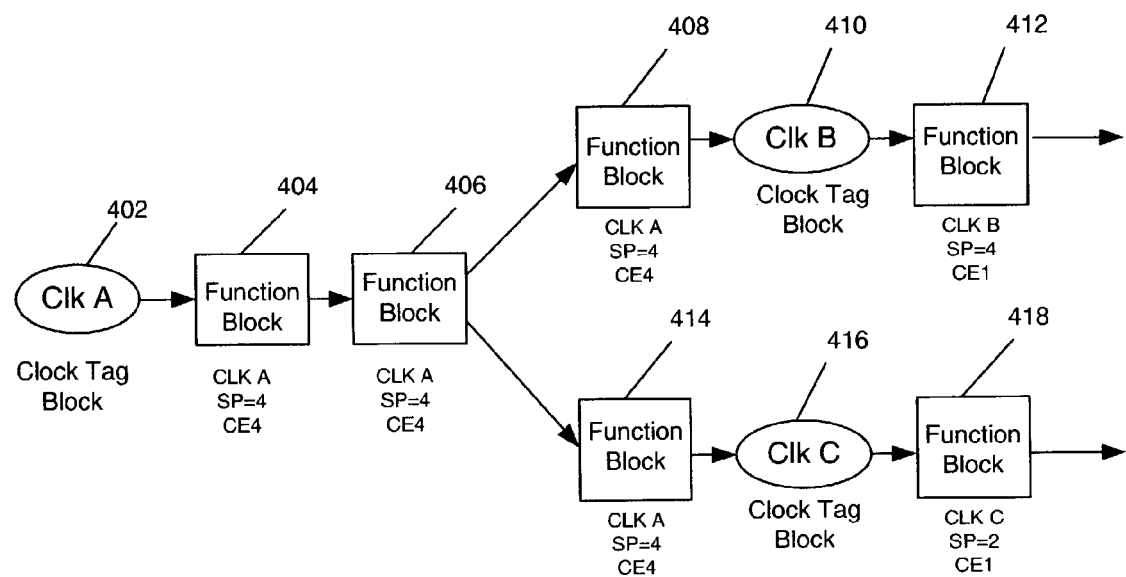
FIG. 4 is a block diagram of a design having a plurality of clock domains implemented by a plurality of clock tags according to the present invention.

Turning now to FIG. 4, a block diagram of an example of a design flow according to the present invention is shown. The following notation is used in the model. SP represents the sample period of the block and CEx represents the clock enable period of the block, where x specifies the integer multiple of the clock rate used to determine the period of the enable cycle. Assume that three clock domains are specified for the design, CLK-A with a period of 4 (offset of 0), CLK-B with a period of 4 (offset of 0) and CLK-C with a period of 1 (offset of 0). With these parameters, all three clocks are synchronous to one another, with CLK-B running four times as slow as CLK-C. The clock domain of CLK C has a sample period of 2. Note that the clocks could be specified as global variables defined in a GUI similar to the one proposed in FIG. 2.

In particular, a clock tag block 402 having a clock domain designated as CLK-A is provided before a first function block 404. The function block 404 operates on a clock domain designated by CLK-A. The clock tag blocks CLK-A, CLK-B and CLK-C could be established as described for example in FIG. 2. A second functional block 406, which is inserted after the function block 402, also operates on the clock domain of CLK-A. Another function block 408 is positioned after the function block 406. Accordingly, because the function block 408 is downstream of the function block 406, the function block 408 also operates on the clock domain of CLK-A. However, because a new clock tag block 410 is inserted after the function block 408, the function block 412 operates on the clock domain of CLK-B. Similarly, a second branch in the design flow having function block 414 operates on the clock domain of CLK-A. However, because a clock tag block 416 is inserted after the function block 414, the function block 418 operates on a clock domain of CLK-C. Accordingly, the propagation of clock domains to the function blocks can be clearly seen.

In determining what it means for a block B to be "downstream" or "after" a block A, the obvious interpretation is that direction is defined by signal flow: B is downstream from A if signals are produced by A, travel through zero or more intermediate blocks, then arrive at B. It must be emphasized, however, that this is not the only possibility. It may be appropriate for a design tool, when determining clock domains, to reverse the sense of direction, and even to intermingle the two senses. Here and throughout, to say B is "downstream" from A or "after" A means B follows A in the search order the design tool applies to the design when determining clock domains. It can but need not mean signals produced by A eventually arrive at B.

Assuming the propagation technique remains the same, any source block that generates an FPGA signal will require that the clock domain be specified in addition to the sample period. The sample period given in the source block will remain the same until a rate change block is encountered. The tool will then determine the appropriate clock enable pulse period by dividing the signal's sample period by the clock domain sample period. Use of this methodology prevents the user from having to specify the desired clock domain in every block. While the figures show domains being propagated downstream, the clock domains could be propagated upstream, or propagated in both directions according to the present invention. Propagation of clock information requires special considerations when a rate change block is introduced into the path.

Figure 5:
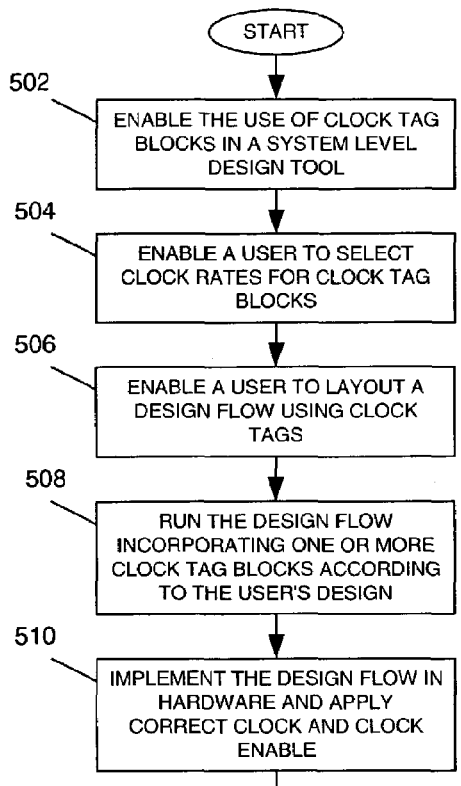
FIG. 5 is a flowchart showing a method of specifying clock domains in a system level design tool according to the present invention.

Turning now to FIG. 5, a flowchart shows a method of associating clock domains with signals in a system level design tool according to the present invention. In particular, a design tool enables the use of a clock tag block in the system level design tool at a step 502. The design tool also enables a user to select clock domains for clock tag blocks at a step 504. A user may then lay out a design flow using the clock tag blocks at a step 506. The design flow is then run incorporating one or more clock tag blocks according to the user's design at a step 508. Finally, the design flow is implemented in hardware and the correct clock and clock enable signals are applied at a step 510.

Figure 6:
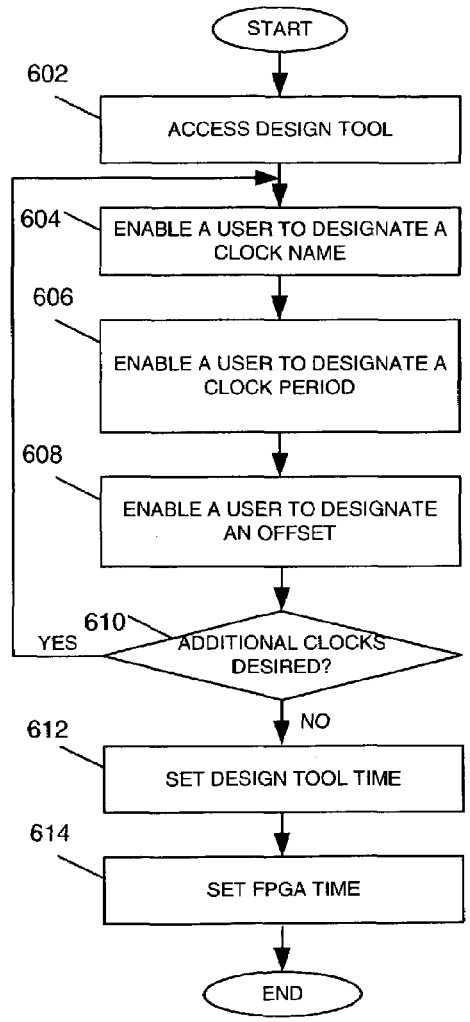
FIG. 6 is a flowchart showing a method of enabling a user to establish multiple clock domains according to the present invention.

Turning now to FIG. 6, a flowchart shows a method of enabling a user to establish multiple clock domains according to the present invention. In particular, a design tool is accessed by a user at a step 602. The user is also enabled to designate a clock name at a step 604 and a corresponding clock period at a step 606. A user is then able to designate an offset at a step 608. It is then determined whether additional clocks are desired to be entered at a step 610. If additional clocks are desired, the user then enters the appropriate clock name, clock period, and offset at steps 604-608. If no additional clock periods are desired, the user can set a design tool time at a step 612, and an FPGA time at a step 614 to establish a relationship between the times.

Figure 7:
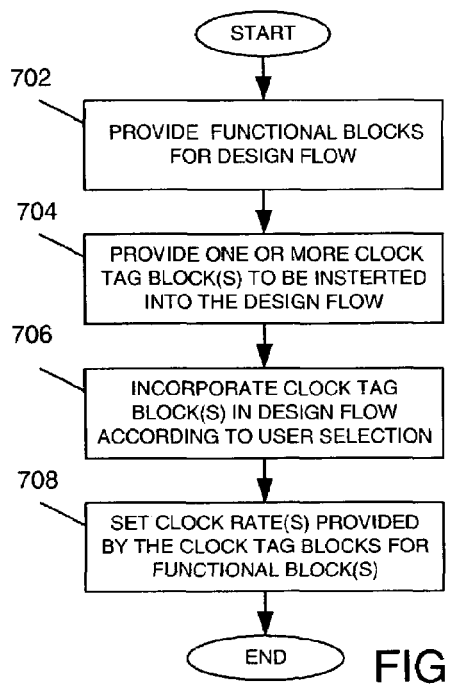
FIG. 7 is a flowchart showing a method of employing clock tag blocks in a design according to the present invention.

Turning now to FIG. 7, a flowchart shows a method of employing clock tag blocks according to the present invention. In particular, functional blocks are provided for a design flow at a step 702. One or more clock tag blocks are provided for a user to insert into the design flow at a step 704. The clock tag blocks are then incorporated into the design flow according to the user's selection at a step 706. Finally, clock domains are provided by the clock tag blocks for various functional blocks in the design flow at a step 708.

Figure 8:
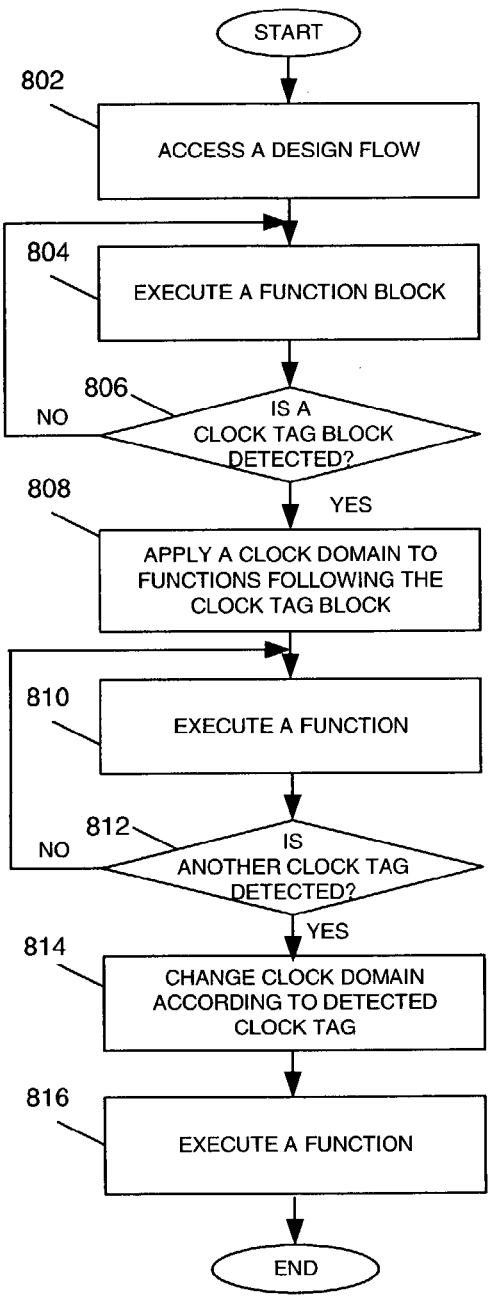
FIG. 8 is a flowchart showing a method of implementing a design having a plurality of clock tag blocks according to the present invention.

Turning now to FIG. 8, a flowchart shows a method of implementing a design flow having a plurality of clock tag blocks according to the present invention. In particular, a design flow is accessed at a step 802. A functional block of the design flow is then executed at a step 804. It is then determined whether a clock tag is detected at a step 806. If a clock tag block is detected, a clock domain is applied to functions following the clock tag block at a step 808. A function of the design flow is then executed at a step 810. It has been determined whether another clock tag block is detected at a step 812. If so, the clock domain is changed according to the detected clock tag block at a step 814. That is, a second clock domain is applied to functional blocks following the second detected clock tag block. A function is then executed at a step 816.

Figure 9:
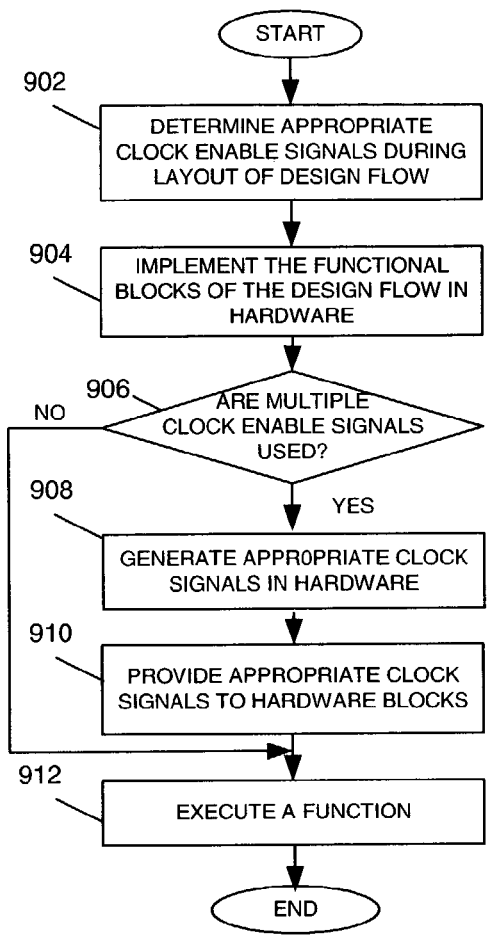
FIG. 9 is a flowchart showing a method of implementing a design having one or several clock domains in a field programmable gate array according to the present invention.

Turning now to FIG. 9, a flowchart shows a method of implementing a field programmable gate array according to the present invention. In particular, appropriate clock enable signals are determined during the layout of the design flow at a step 902. Functional blocks of the design flow are implemented in hardware at a step 904. It is then determined whether multiple clock enables signals are used at a step 906. If so, the appropriate clock signals are generated in hardware at a step 908. The appropriate clock singles are then provided to hardware blocks at a step 900. A function is then executed in hardware at a step 902.

The method and apparatus of the present invention are flexible, and eliminates the inconvenience of manually specifying clock domains for each block in the design. Changes to the clock tag in a source or clock tag block are automatically reflected in downstream and/or upstream blocks. These clocks can be either synchronous or asynchronous.

It can therefore be appreciated that the new and novel method and apparatus for specifying clock domains in electronic designs has been described. It will be appreciated by those skilled in the art that, given the teaching herein, numerous alternatives and equivalents will be seen to exist which incorporate the disclosed invention. As a result, the invention is not to be limited by the foregoing embodiments, but only by the following claims.

The invention claimed is:

1. A method of specifying clock domains for electronic designs in a system level design tool, said method comprising the steps of:

providing a design having a plurality of functional blocks;

incorporating a clock tag block having a selected clock rate within said design;

setting a clock domain provided by said clock tag block for a functional block of said plurality of functional blocks; and implementing said design using said clock rate provided by said clock tag block.

2. The method of claim 1 wherein said step of incorporating a clock tag block within said design comprises providing a clock domain for predetermined functional blocks within said design.

3. The method of claim 1 wherein said step of setting a clock domain comprises setting a clock domain for functional blocks after said clock tag block.

4. The method of claim 1 further comprising a step of detecting a second clock tag block within said design.

5. The method of claim 4 further comprising a step of providing a second clock domain for functional blocks after said second clock tag block.

6. A method of associating clock domains with functional blocks in a system level design tool, said method comprising the steps of:

providing functional blocks within a design;

enabling a clock tag block having a selected clock rate to be inserted within said design;

detecting a clock tag block within said design;

setting a clock domain provided by the clock tag block for at least one functional block in said design; and implementing said design using said clock rate provided by said clock tag block.

7. The method of claim 6 wherein said step of setting a clock domain comprises providing a clock domain for predetermined functional blocks within said design.

8. The method of claim 6 wherein said step of setting a clock domain comprises providing a clock domain for functional blocks after said clock tag block.

9. The method of claim 6 further comprising a step of providing a plurality of clock tag blocks within said design.

10. The method of claim 9 further comprising a step of setting a clock domain for functional blocks after each said clock tag block of said plurality of clock tags within said design.

11. A method of associating clock domains with functional blocks in a system level design tool, said method comprising the steps of:

enabling a plurality of clock tag blocks to be inserted within a designs each clock tag block having a selected clock rate;

providing a design flow incorporating said plurality of clock tag blocks;

detecting a predetermined clock tag block within a design;

providing a clock domain designated by the predetermined clock tag block for functional blocks after said predetermined clock tag block in the design; and implementing said design using said clock rate provided by said clock tag block.

12. The method of claim 11 wherein said step of providing a design incorporating said plurality of clock tag blocks comprises providing a clock domain for predetermined functional blocks within said design.

13. The method of claim 11 further comprising a step of detecting a second clock tag block within said design.

14. The method of claim 13 further comprising a step of changing the clock domain for functional blocks after said second clock tag block.

15. The method of claim 11 wherein said step of providing a clock domain comprises setting a clock domain for each functional block of said plurality of functional blocks after each said clock tag block, respectively, of said plurality of clock tag blocks.

16. A method of associating clock signals with functional block signals in a system level design tool, said method comprising the steps of:

enabling the selection of a plurality of clock domains;

enabling a plurality of clock tag blocks to be inserted within a design;

providing a clock tag block having a selected clock rate within said design;

detecting a clock tag block within a design flow when implementing said design;

providing a clock domain of said plurality of clock domains associated with said clock tag block for functional blocks after said clock tag block when implementing said design; and implementing said design using said clock rate provided by said clock tag block.

17. The method of claim 16 wherein said step of enabling a plurality of clock tag blocks to be inserted within said design comprises enabling clock tag blocks having said selected clock domains to be inserted within said design.

18. The method of claim 16 wherein said step of enabling a plurality of clock tag blocks to be inserted within said design comprises providing a selected clock rate for predetermined functional blocks within said design.

19. The method of claim 16 further comprising a step of detecting a plurality of clock tag blocks within said design.

20. The method of claim 19 further comprising a step of changing the clock rate for functional blocks after each said clock tag block of said plurality of clock tag blocks.

21. The method of claim 16 further comprising a step of enabling the selection of a design tool time.

22. The method of claim 21 further comprising a step of enabling the selection of a time in hardware.

23. The method of claim 22 further comprising a step of establishing a relationship between said design tool time and said time in hardware.

24. A design tool enabling the association of clock domains with functional blocks in a system, said design tool comprising:

a plurality of functional blocks;

a clock tag block having a selected clock rate, said clock tag block providing said selected clock rate for at least one functional block of said plurality of functional blocks; and a user interface enabling the selection of said functional blocks and said clock tag block in a design.

25. The apparatus of claim 24 further comprising a plurality of clock tag blocks.

26. The apparatus of claim 25 wherein said plurality of clock tag blocks correspond to plurality of clock signals.

27. The apparatus of claim 25 wherein said user interface further enables the selection of said plurality of clock signals.

28. The apparatus of claim 24 further comprising an output of said design tool.

29. A design tool enabling the association of domains with functional blocks in a system, said design tool comprising:

a memory storing a plurality of functional blocks and a clock tag block, said clock tag block having a selected clock rate and providing said selected clock rate for functional blocks;

a processor coupled to said memory and running said design tool;

a user interface coupled to said processor and enabling the selection of said functional blocks and said clock tag block to be inserted into a design; and a display coupled to said processor and displaying an output of said design tool.

30. The apparatus of claim 29 further comprising a plurality of clock tag blocks.

31. The apparatus of claim 30 wherein said plurality of clock tag blocks correspond to plurality of clock signals.

32. The apparatus of claim 31 wherein said user interface further enables the selection of said plurality of clock signals.

33. A design tool enabling the association of clock domains with signals in a system, said design tool comprising:

a memory storing a plurality of functional blocks and a plurality of clock tag blocks, each said clock tag block having a selected clock rate provided to predetermined functional blocks;

a processor coupled to said memory and running said design tool;

a user interface coupled to said processor and enabling the selection of clock rates for said clock tag blocks and the selection of said functional blocks and clock tag blocks to be inserted into a design; and a display coupled to said processor and displaying an output of said design tool.

* * * * *